United States Patent [19]

Makuta

[11] Patent Number: 5,353,298
[45] Date of Patent: Oct. 4, 1994

[54] HIGH POWER DISTRIBUTED FEEDBACK SEMICONDUCTOR LASER EXCELLENT IN LINEARITY OF LIGHT OUTPUT

[75] Inventor: Akio Makuta, Yokohama, Japan

[73] Assignee: Kabushiki Kaisha Toshiba, Kawasaki, Japan

[21] Appl. No.: 115,145

[22] Filed: Sep. 2, 1993

[30] Foreign Application Priority Data

Sep. 7, 1992 [JP] Japan .................. 4-238134

[51] Int. Cl.⁵ .................. H01S 3/08; H01S 3/19
[52] U.S. Cl. .................. 372/96; 372/46; 372/49
[58] Field of Search ............ 372/96, 45, 46, 49, 372/50

[56] References Cited

U.S. PATENT DOCUMENTS

| | | | |
|---|---|---|---|
| 5,012,484 | 4/1991 | Flynn et al. | 372/96 |
| 5,285,468 | 2/1994 | Ackerman | 372/96 |

FOREIGN PATENT DOCUMENTS

| | | |
|---|---|---|
| 0195425A3 | 9/1986 | European Pat. Off. |
| 0436300A3 | 7/1991 | European Pat. Off. |
| 61-143609 | 6/1986 | Japan |
| 1051687 | 2/1989 | Japan |
| 2-19987 | 5/1990 | Japan |

OTHER PUBLICATIONS

G. Chen et al., "Distributed feedback lasers with distributed phase-shift structure", Applied Physics Letters, 60 (1992) May 25, No. 21, New York.
Shouichi Ogita et al., "Long-Cavity Multiple-Phase-Shift Distributed Feedback Laser Diode for Linewidth Narrowing," Journal of Lightwave Technology, Oct. 8, 1990, No. 10, New York.
Masashi Usami et al., "Asymmetric λ/4-Shifted InGaAsP/InP DFB Lasers," I.E.E.E. Journal of Quantum Electronics, QE-23, Jun. 1987, No. 6, N.Y.
"λ/4-Shifted InGaAsP/InP DFB Lasers", Utaka et al., IEEE Journal of Quantum Electronics, vol. QE-22, No. 7, pp. 1042-1051, Jul. 1986.
"Stability in Single Longitudinal Mode Operation in GaInAsP/InP Phase-Adjusted DBF Lasers", Soda et al., IEEE Journal of Quantum Electronics, vol. QE-23, No. 6, pp. 804-814, Jun. 1987.

*Primary Examiner*—James W. Davie
*Attorney, Agent, or Firm*—Finnegan, Henderson, Farabow, Garrett & Dunner

[57] ABSTRACT

A periodic structure is formed along the laser medium in the axial direction of a cavity. One of the end facet of the cavity has high reflectivity and the other end facet has low reflectivity. A phase discontinuous portion of the periodic structure is disposed in position deviated from the central portion of the cavity towards the high-reflectivity end facet. The phase discontinuous portion is formed of a phase shifting portion or a phase shifting area having the same effect as the phase discontinuity. The phase shift $\Delta\Phi$ of the phase shifting portion or phase shifting area is set to exceed $3\pi/4$ which is represented in terms of the phase of waveguiding light (which corresponds to $3\lambda/8$ when the lasing wavelength is $\lambda$). Thus, the performances of high power and linearity of light output can be simultaneously achieved.

4 Claims, 3 Drawing Sheets

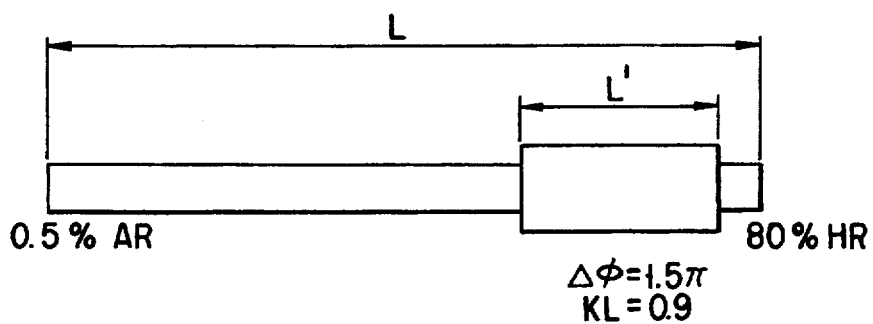
F I G. 4
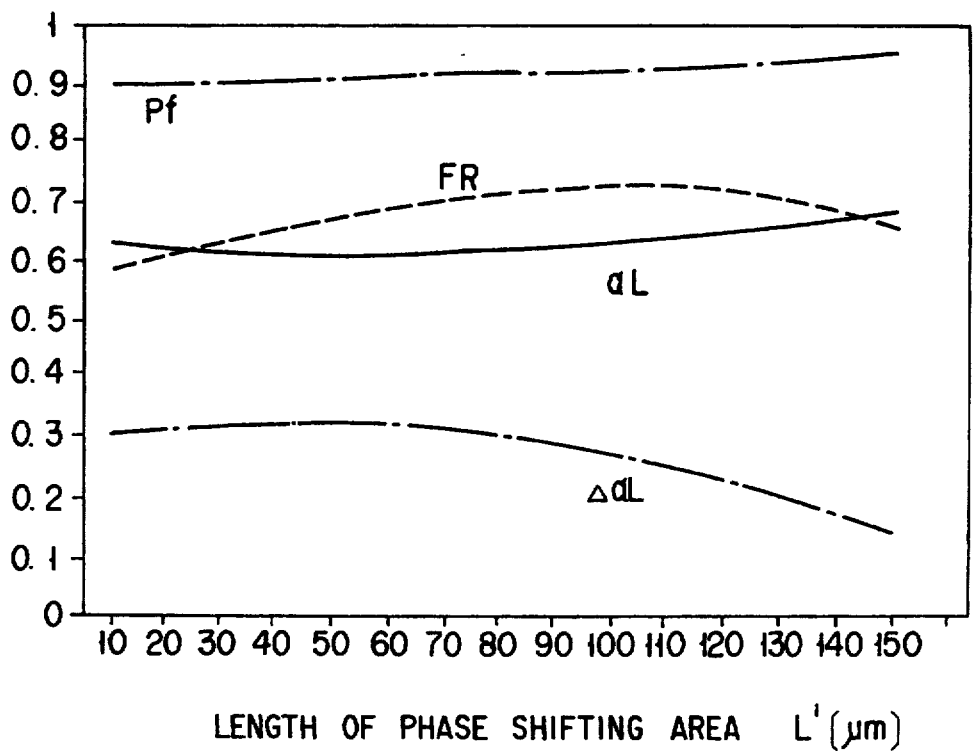
LENGTH OF PHASE SHIFTING AREA   L' (μm)
F I G. 5
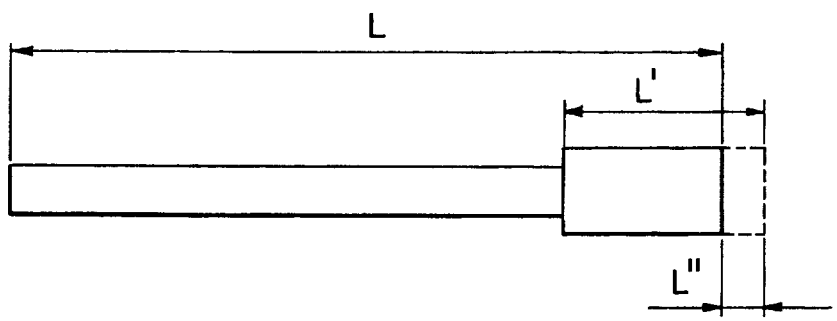
F I G. 6

HIGH POWER DISTRIBUTED FEEDBACK SEMICONDUCTOR LASER EXCELLENT IN LINEARITY OF LIGHT OUTPUT

Background of the Invention

1. Field of the Invention

This invention relates to the improvement of a distributed feedback semiconductor laser oscillating in a single longitudinal mode.

2. Description of the Related Art

Since a distributed feedback semiconductor laser (which is hereinafter referred to as a DFB laser) has the property of oscillating in a single longitudinal mode, the application thereof is wide and the frequency in use thereof is high in a wide range of field containing communication field.

Conventionally, it is pointed out that the DFB laser does not always oscillate in a single longitudinal mode when the diffraction grating thereof is formed with a periodic structure in which the phase continuously varies. As a means for solving the above problem, the following two phase shifting structures are proposed.

The first structure is a $\lambda/4$ phase shifting structure. This structure is obtained by disposing a phase shifting portion, that is, phase discontinuous portion of $\pi/2$ which is represented in terms of the phase of waveguiding light (which corresponds to $\lambda/4$ when represented in terms of lasing wavelength) in the central portion of a cavity in an axial direction thereof (light emitting direction). With the above structure, the improvement of the oscillation probability in the single longitudinal mode is recognized (IEEE JOURNAL OF QUANTUM ELECTRONICS, VOL. QE-22, NO. 7, JULY 1986 (this is hereinafter referred to as a first document)).

The second structure is an equivalent phase shifting structure. This structure is obtained by changing part of the shape of the waveguide, for example, partly reducing or increasing the width thereof (the width-increased or reduced portion is called a phase shifting area). As a result, the same effect as that obtained by disposing a phase discontinuous portion in the diffraction grating can be attained. Also, with this structure, the improvement of the oscillation probability in the single longitudinal mode is recognized (IEEE JOURNAL OF QUANTUM ELECTRONICS, VOL. QE-23, NO. 6, JULY 1987 (this is hereinafter referred to as a second document)).

In the above conventional phase shifting type DFB lasers, both end facets are formed to have a reflectance nearly equal to zero. Therefore, in the above DFB laser, laser lights of the same power are generated from the both end facets. If it is desired to generate laser light from only the front end facet of the DFB laser at a high efficiency, the above two structures are disadvantageous.

It is easily estimated that, in the above two DFB lasers, if the reflectivity of the end facet on the light emission side (front end facet) is set low and the reflectivity of the end facet (rear end facet) opposite to the front end facet is set high like the Fabry-Perot semiconductor laser, a relatively high power can be obtained from the front and facet.

However, when the $\lambda/4$ phase shifting structure preposed to improve the yield of the single longitudinal mode and the structure in which the reflectivity of the front and rear end facets are made asymmetric or different from each other to enhance the output power are simultaneously used, it is necessary to pay much attention to the relation between them. This is because the $\lambda/4$ phase shifting structure is designed on condition that the phase shifting portion is set in the central portion of the resonator as shown in FIG. 1, for example, and both end facets are used as anit-reflection coated.

In FIG. 1, 11 denotes an n-type InP substrate, 12 denotes an n-type InGaAsP guiding layer, 13 denotes an undoped InGaAsP active layer, 14 denotes a p-type InP cladding layer, 15 denotes a p-type InGaAsP contacting layer, 16 denotes electrodes, and 17 anti-reflection films A diffraction grating with a period of 2400[Å] or 0.24 [$\mu$m] is formed on the surface of the substrate 11 along the axial direction (light emitting direction) of the resonator.

The DFB laser is conventionally used for digital long-haul and high bit-rate optical communication which is the main application of $\lambda/4$ phase shifting, and in recent years, it is also used as a light emitting source of an optical CATV for image and voice transmission by AM modulation. The performance required for the DFB laser when it is used for the above applications is a small threshold current and single longitudinal mode, and a high light output power and current-light output linearity. This is because the non-linearity of light output becomes the main cause of deterioration in the reception sensitivity due to relative modulation distortion between channels at the time of multi-channel AM transmission. Further, the high light output power enlarges the margin of the linearity of light output.

Conventionally, as a DFB laser using the $\lambda/4$ phase shifting structure and having two end facets whose reflectivity are made asymmetrical or different from each other to obtain a high output power, an invention disclosed in Japanese Patent Publication No. H.2-19987 is known, for example. In this invention, a phase shifting portion having a phase shift of $\lambda/4$ is disposed in position deviated from the central portion of the resonator towards the end facet of high reflectivity. However, in this invention, the reflectivity of the rear end facet, phase shift and the position of the phase shifting portion are inadequate.

Thus, conventionally, as the application of the DFB laser is widely extended, the DFB laser is required to have performances such as the small threshold current, oscillation probability in the single longitudinal mode, and high power and linearity of light output, but a DFB laser satisfying the above requirement is not provided.

SUMMARY OF THE INVENTION

This invention has been made to solve the above problems an object of this invention is to provide a DFB laser having end facets whose reflectivity are asymmetrical or different from each other and attaining performances of high power and linearity of light output.

In order to attain the above object, a high power distributed feedback semiconductor laser of this invention which is excellent in the linearity of light output has a structure of periodic structure formed along the laser medium in the axial direction of a cavity, one of the end facet of the resonator has high reflectivity, the other end face has low reflectivity, a phase shifting portion, that is, a phase discontinuous portion of the periodic structure is disposed in position deviated from the central portion of the resonator towards the high-reflectivity end facet, and the phase shift $\Delta\Phi$ of the phase shifting portion is set to exceed $3\pi/4$ which is represented in terms of the phase of waveguide light (which corresponds to 3λ/8 when lasing wavelength is λ).

Further, the laser has a structure of periodic structure formed along the laser medium in the axial direction of a cavity, one of the end facet of the cavity has high reflectivity, the other end facet has low reflectivity, a phase shifting area having the same effect as the phase discontinuous portion of the periodic structure is disposed in position deviated from the central portion of the resonator towards the high-reflective end facet, and the phase shift ΔΦ of the phase shifting area is set to exceed 3π/4 when represented in terms of the phase of waveguiding light (which corresponds to 3λ/8 when lasing wavelength is λ).

The length of the phase shifting area in the axial direction is equal to or more than 1/10 of the total length of the cavity in the axial direction.

Further, in a case where a plurality of phase shifting portions or phase shifting areas are provided in the resonator and when the axial direction (light emitting direction) of the cavity is set as an X axis, the central portion of the resonator is set as an origin O (X=0), one end facet side is set negative and the other end facet side is set positive, then the weighted mean value of distances Li (i=1, 2, ---) from the origin O to the central points of the respective phase shifting portions or phase shifting areas is derived by use of the phase shifts ΔΦi (i=1, 2, ---) of the phase shifting areas as weights and is defined as the centroid G, that is, G=Σ(Li·ΔΦi)/Σ-ΔΦi, and when the position of the centroid G is negative, the one end facet is set to have high reflectivity and the other end facet is set to have low reflectivity, and when the position of the centroid G is positive, the one end facet is set to have low reflectivity and the other end facet is set to have high reflectivity.

With the above construction, the phase shift ΔΦ of the phase shifting portion or phase shifting area of the distributed feedback semiconductor laser is set to exceed 3π/4 which is represented in terms of the phase of waveguiding light (which corresponds to 3λ/8 when lasing wavelength is λ). As a result, the performances of high power and linearity of light output can be simultaneously attained. Further, when a plurality of phase shifting portions or phase shifting areas are provided, the centroid G is defined and the reflectivity of the end facet are easily and adequately set to high or low values depending on the position of the centroid G.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 a view showing the waveguide of a DFB laser according to this invention;

FIG. 5 is a diagram showing the relation between the length L' of the phase shifting area and preset parameters;

FIG. 6 is a view showing the waveguide of a DFB laser according to this invention;

DETAILED DESCRIPTION OF THE PREFERRED EMBODIMENTS

There will now be described an embodiment of this invention with reference to the accompanying drawings.

A phase shifting DFB laser has a feature that the peak of the light intensity distribution tends to occur in the phase shifting portion or phase shifting area as is described in the first and second documents referred to in the "Description of the Related Art" (in this case, an error caused by a value of the coupling coefficient k is neglected). This tendency is significant in the conventional DFB laser of λ/4 phase shifting structure. However, when the DFB laser is used in a digital fashion, the non-linearity of light output caused by the above phenomenon can be neglected.

This invention utilizes the effect obtained by phase matching of waveguiding lights on the right and left portions of the phase shifting portion by disposing the phase shifting portion in position near the end facet of high reflectivity in which the mode distribution tends to be deteriorated in the DFB laser having the end facets whose reflectivity are asymmetrical or different from each other. As a result, the oscillation in the single longitudinal mode, suppression of deterioration in the light intensity distribution near the end facet and the improvement of the performance such as the linearity of light output can be attained.

[A] First, the phase shifting for obtaining the optimum light output and linearity is discussed.

The phase shifting portion is disposed in position deviated from the central portion of the cavity towards the high-reflectivity side.

Figure 2:
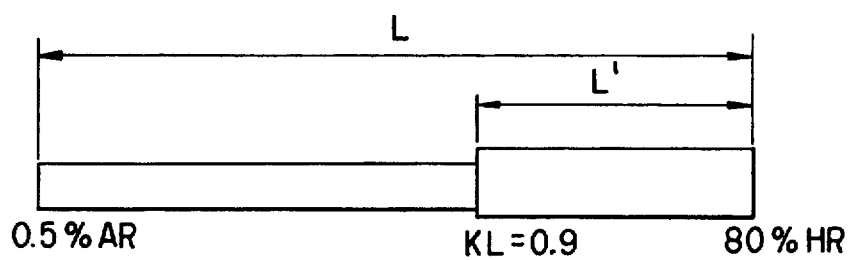
FIG. 2 is a view showing the waveguide of a DFB laser according to this invention.
Figure 3:
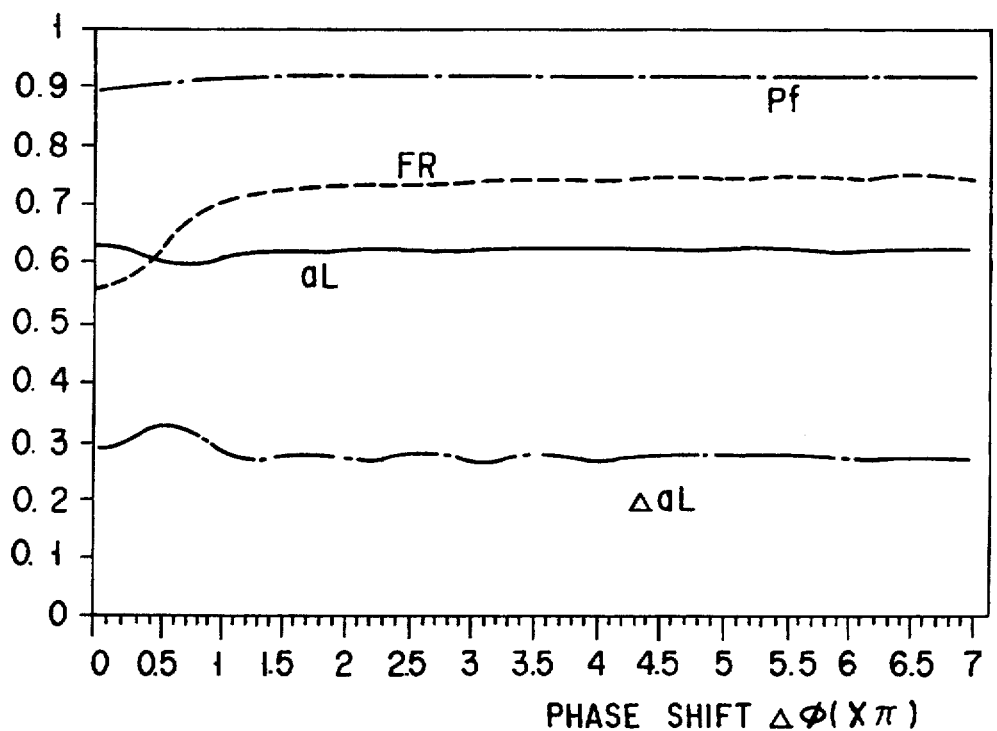
FIG. 3 is a diagram showing the relation between the phase shift ΔΦ and preset parameters.

FIG. 2 schematically shows the shape of the waveguide of a DFB laser according to this invention. FIG. 3 shows the relation between a variation in the phase shift ΔΦ and variations in four parameters (Pf, FR, αL, ΔαL) indicating the performance of the DFB laser derived by calculation.

In this embodiment, a DFB laser of equivalent phase shifting structure obtained by increasing the width of part of the waveguide to form a phase shifting area is explained as an example. The total length L of the resonator is approx. 300 [μm]. Further, the width of part of the active layer is increased and the width increased portion is used as a phase shifting area. The length L' of the phase shifting area is approx. 100 [μm] and the center thereof is set in position at which the resonator is divided with the low-reflectivity portion: high-reflectivity portion=5:1, that is, in position which is separated by 300×(5/6)=250 [μm] from the front end facet of the resonator.

Further, the normalized coupling coefficient kL is set to 0.9, the reflectivity of the end facet is set to low reflectivity of 0.5% (0.5% AR) at the front end facet and to high reflectivity of 80% (80% HR) at the rear end facet. Light of high power can be obtained from the front end facet by setting the reflectivity of the rear end facet as close to 100% as possible. However, in practice, the reflectivity of the rear end facet is generally set to reflectivity of approx. 80% since it is necessary to take out monitor light output from the rear end facet.

FR indicates the ratio (mode distribution ratio) of the minimum value and maximum value of the intensity of waveguiding light in the cavity. As the mode distribution ratio FR is set to be closer to 1, the mode distribution in the resonator is uniform and the linearity of light output becomes excellent.

Japanese Patent Publication No. H.2-19987 discloses that it is necessary to set the phase shift $\Delta\Phi$ provided on the high-reflectivity end facet in the range of $\Delta\Phi = \pi/4$ to $3\pi/4$. The phase shift $\Delta\Phi$ corresponds to $\lambda/8$ to $3\lambda/8$ when represented in terms of the lasing wavelength.

However, the inventor of this application found the fact shown in FIG. 5.

That is, when the phase shift $\Delta\Phi$ is set to approx. $\pi/2$, the oscillation threshold gain difference $\Delta\alpha L$ becomes maximum, but the mode distribution ratio FR becomes extremely small. Therefore, in this region, the oscillation probability in the single longitudinal mode becomes high, but the linearity of light output is deteriorated.

Further, in a region in which the phase shift $\Delta\Phi$ is more than $3\pi/4$, the oscillation threshold gain difference $\Delta\alpha L$ is somewhat reduced, but the mode distribution ratio becomes large. In this region, the light output Pf of the front end facet is high.

Further, when the phase shift $\Delta\Phi$ is set to approx. $3\pi/4$, the threshold gain $\alpha L$ used as an indication of the oscillation threshold becomes minimum.

Therefore, it is understood from the above description that a DFB laser having the phase shift $\Delta\Phi$ which satisfies the condition expressed by the following expression (1) may be formed to obtain an element which has a high power and is excellent in the linearity of light output and achieve the object of this invention.

$$\Delta\Phi > 3\pi/4 \tag{1}$$

In the above embodiment, a DFB laser of the equivalent phase shifting structure obtained by increasing the width of part of the waveguide to form a phase shifting area is explained as an example, but if the phase shift $\Delta\Phi$ satisfies the condition expressed by the expression (1), this can be applied to a DFB laser of phase shifting structure in which the phase discontinuous portion is formed in the diffraction grating.

[B] Next, the length L' in the axial direction of the phase shifting area having the same effect as the phase discontinuity in the DFB laser of the equivalent phase shifting structure is discussed.

In the conventional DFB laser of $\lambda/4$ phase shifting structure as described above, waveguiding light is concentrated in a portion near the phase shifting portion in the central portion of the resonator and the end face of the resonator and a so-called axial hole burning phenomenon that the axial mode distribution becomes non-uniform occurs. This phenomenon causes deterioration in the oscillation spectrum and mode distribution, and it is necessary to suppress occurrence of the phenomenon in order to obtain a linear light output which is an object of this invention.

It is well known in the art that the axial hole burning can be suppressed if the equivalent phase shifting structure is used (refer to the second document). This is because waveguiding light is concentrated on the phase discontinuous portion (phase shifting portion) in the case of the conventional phase shifting structure obtained by use of the phase discontinuous portion of the diffraction grating and waveguiding light can be dispersed in the phase shifting area having a preset length in the case of the equivalent phase shifting structure.

Therefore, variations in the above four parameters (Pf, FR, $\alpha L$, $\Delta\alpha L$) caused when the phase shift of the DFB laser is fixed at a value lying in the range indicated by the conditional expression (1), for example, at $3\pi/4$ and the length L' of the phase shifting area is changed are examined.

As shown in FIG. 4, the total length of the resonator in the axial direction is approx. 300 [μm]. The central point of the phase shifting area is set in such a position as to divide the resonator to 5:1. The normalized coupling coefficient kL is set to 0.9, the reflectivity of the end facet is set to low reflectivity of 0.5% (0.5% AR) at the front end facet and to high reflectivity of 80% (80% HR) at the rear end facet.

As shown in FIG. 5, as the length L' of the phase shifting area is increased, the oscillation threshold gain difference $\Delta\alpha L$ is gradually reduced, but the mode distribution ratio is increased. This phenomenon is significant in a region in which the length L' of the phase shifting area is larger than approx. 30 [μm], that is, in a region in which the length is larger than 1/10 of the total length L of the cavity. Therefore, the length L' of the phase shifting area is set to a value which is equal to or larger than 1/10 of the total length L of the cavity, a large mode distribution ratio FR can be obtained.

The inventor of this application has confirmed that the above relation is set up in a case where the total length L of the cavity is larger than 300 [μm], for example, in a DFB laser in which the total length L set to reduce the spectral line width or the like is larger than 1.0 [mm].

Therefore, it is understood from the above description that a DFB laser in which the total length L of the resonator and the length L' of the equivalent phase shifting area satisfy the condition expressed by the following expression (2) may be formed to obtain an element which has a high power and is excellent in the linearity of light output and achieve the object of this invention.

$$L'/L \geq 1/10 \tag{2}$$

Further, when it is desired to enhance the output of the laser by increasing the reflectivity of the rear end facet, a large mode distribution ratio FR can be obtained by setting the phase shifting area near the rear end facet. In this case, if the phase shifting area is set too close to the rear end facet, the end portion of the phase shifting area may sometimes exceed the rear end facet of the DFB laser as shown in FIG. 6. The exceeding portion L'' cannot be used as a phase shifting area, but the performance of the element can be maintained.

[C] Next, a DFB laser having a plurality of phase shifting portions or phase shifting areas in the resonator is explained.

The reason why a plurality of phase shifting portions or phase shifting areas are set in the resonator is to attain the phase matching of the waveguiding light in the resonator and make the mode distribution uniform. In the above DFB laser, this invention is effective. However, in this case, it is not always easy to adequately set each of the reflectivity of the end facets to high or low reflectivity. Therefore, the following method becomes effective.

In a case where the reflectivity of the end facets are set to asymmetrical reflectivity to obtain a high power and the linearity of light output, it is a common practice to arrange a plurality of phase shifting portions asymmetrically in the cavity. Assume now that the axial direction (light emitting direction) of the resonator is set as an X axis and the center of the resonator is set as an origin O (X=0). Further, assume that one end facet side is set negative and the other end facet side is set positive.

Then, the weighted mean value of distances $L_i$ ($i=1, 2,\cdots$) from the origin to the central points of the respective phase shifting areas is derived by using the phase shifts $\Delta\Phi_i$ ($i=1, 2,\cdots$) of the phase shifting areas as weights and is defined as the centroid G.

$$G = \Sigma(L_i \cdot \Delta\Phi_i)/\Sigma\Delta\Phi_i \qquad (3)$$

Therefore, when a value of the centroid G derived based on the equation (3) is negative, the one end face may be set to have high reflectivity and the other end facet may be set to have low reflectivity. On the other hand, when a value of the centroid G derived based on the equation (3) is positive, the one end facet may be set to have low reflectivity and the other end facet may be set to have high reflectivity.

Figure 7:
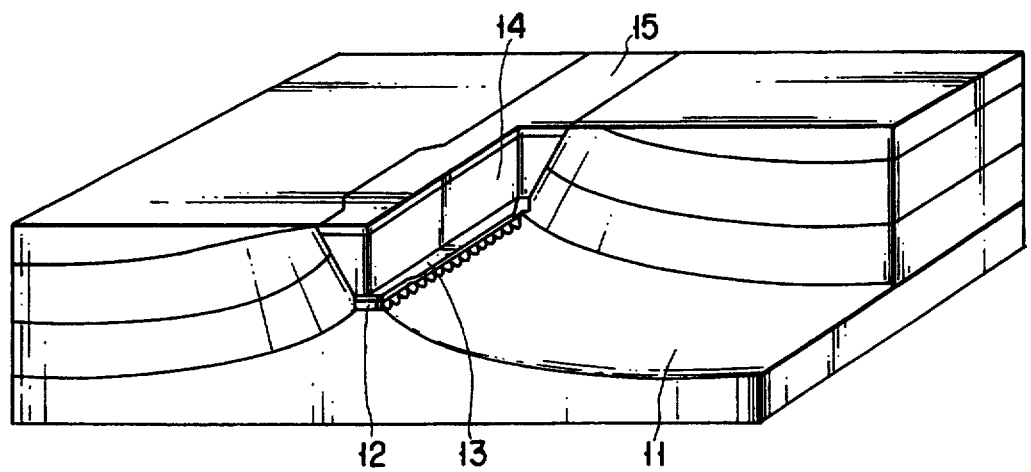
FIG. 7 is a view showing a DFB laser according to this invention.
Figure 8:
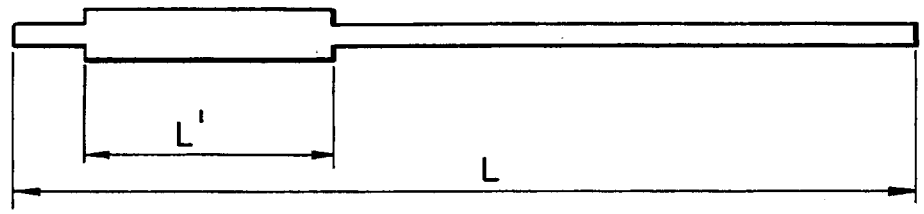
FIG. 8 is a view showing the waveguide of a DFB laser according to this invention.

FIG. 7 is a view showing the partial cross section of a DFB laser element. FIG. 8 shows only a wave guide (guiding layer 12, active layer 13) shown in FIG. 7.

In this element, an equivalent phase shifting structure is used, the phase shift is set to $\pi$, and the length L' of the phase shifting area is set to $\frac{1}{3}$ of the total length of the resonator (for example, L=300 [$\mu$m] and L'=100 [$\mu$m]).

A diffraction grating having a period of approx. 0.24 [$\mu$m] along the axial direction (light emitting direction) of the resonator is formed on an n-type Inp substrate 11 by use of a two-beam interference exposure method and chemical etching method.

Further, an n-type InGaAsP guiding layer 12, undoped InGaAsP active layer 13, p-type InP cladding layer 14, and p-type InGaAsP contacting layer 15 are formed by an organic metal vapor deposition method.

Further, an SiO$_2$ film is formed on the entire surface and the SiO$_2$ film is patterned in a stripe form. At this time, a mask pattern is so formed that the center of the phase shifting area (or phase shifting portion) is set in position deviated from the central portion of the cavity towards the end facet of high reflectivity.

Further, mesa-etching for forming a laser stripe by use of bromine-series anisotropic etchant is effected. As a result, an active layer can be obtained in a form as shown in FIG. 8, for example. Further, the side surface of the laser stripe is buried in the semiconductor by liquid crystal growth. Although not shown in the drawing, electrodes are formed, and after the cleavage in a bar form, asymmetrical reflectivity coating is formed on both of the end facets by the CVD method or the like.

Figure 9:
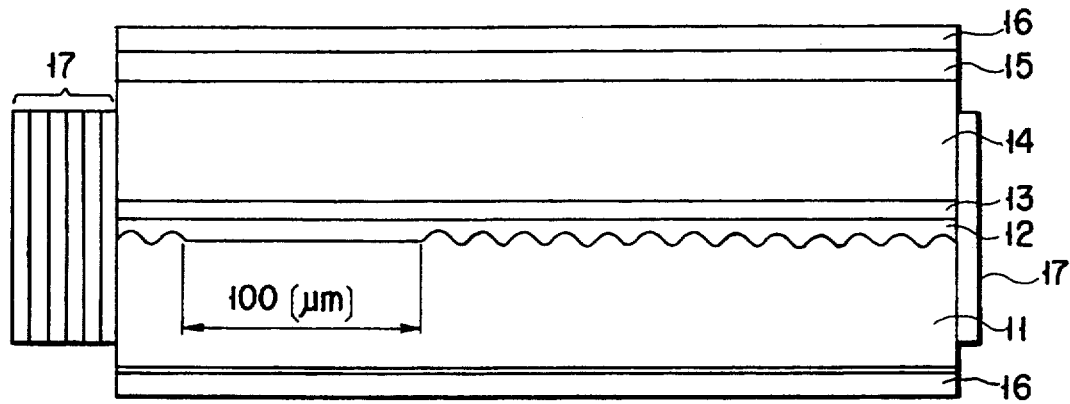
FIG. 9 is a cross sectional view showing a DFB laser according to this invention.

FIG. 9 shows a DFB laser in which discontinuous portions (the end portion of the diffraction grating on the left side, the end portion of the diffraction grating on the right side, phase shifting portion) of the diffraction grating are connected in a flat area of 100 [$\mu$m]. This invention can be applied to the above DFB laser. In this embodiment, the diffraction grating having a phase shifting portion can be formed by electron beam exposure and chemical etching. Portions other than the diffraction grating and waveguide are the same as those of FIGS. 5 and 6.

Figure 1:
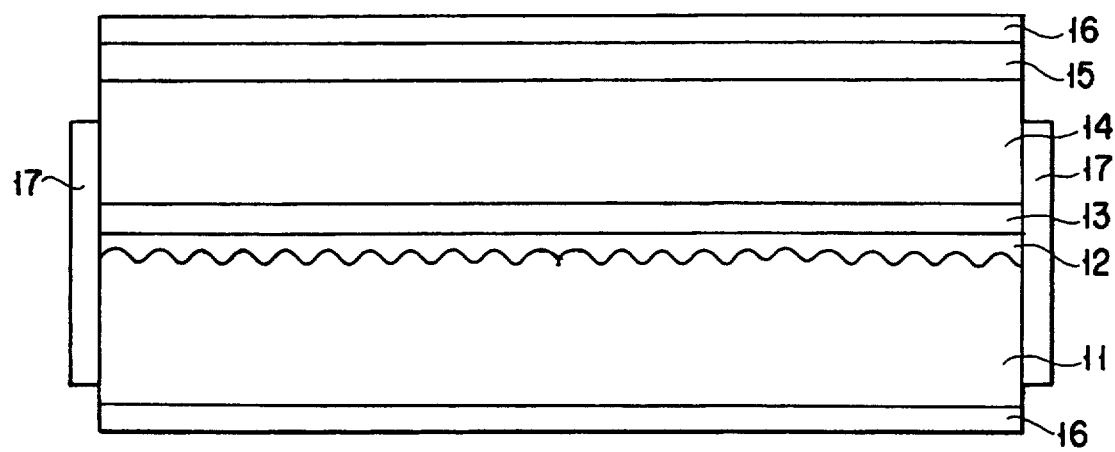
FIG. 1 is a cross sectional view showing a conventional DFB laser.
Figure 10:
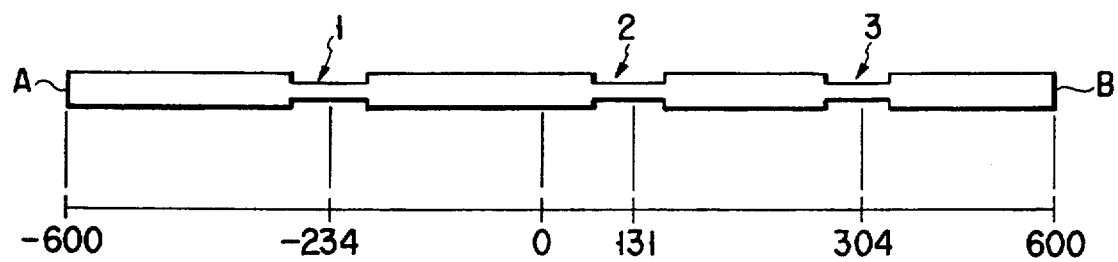
FIG. 10 is a view showing the waveguide of a DFB laser having a plurality of phase shifting areas.

FIG. 10 shows the active layer of a DFB laser having a plurality of phase shifting areas formed in the cavity. Further, portions other than the shape of the active layer are constructed to satisfy the conditional expressions (1) and (2). This embodiment is a DFB laser of equivalent phase shifting structure and may be a DFB laser having such phase discontinuous portions as shown in FIGS. 1 and 9.

In FIG. 10, three phase shifting areas are provided and the phase shifting areas 1 to 3 are formed by reducing (or increasing) the width of the wave guide. The phase shifts thereof are set such that $\Delta\Phi_1 = \Delta\Phi_2 = \Delta\Phi_3 = 3\pi/2$ and the length L' of the phase shifting areas 1 to 3 is set to 50 [$\mu$m]. Further, the total length L of the resonator is set to 1200 [$\mu$m].

Assume now that the central portions of the phase shifting areas 1 to 3 are set in positions which are set at distances of 366 [$\mu$m], 366 [$\mu$m] and 234 [$\mu$m] from one end facet A towards the other end facet B. Further, assume that the axial direction (light emitting direction) of the resonator is set as an X axis and the central portion of the cavity is set as an origin O (X=0). In addition, assume that one end facet A side is set negative and the other end face B side is set positive. Then, distances $L_i$ ($i=1, 2,\cdots$) from the origin O to the central points of the respective phase shifting portions or phase shifting areas are calculated and $L_1=-234$, $L_2=131$ and $L_3=304$ are derived.

Therefore, the centroid G of the cavity can be derived as follows by use of the equation (3).

$$\begin{aligned} G &= \{(L_1 \cdot \Delta\Phi_1) + (L_2 \cdot \Delta\Phi_2) + (L_3 \cdot \Delta\Phi_3)\} \div \\ &\quad (\Delta\Phi_1 + \Delta\Phi_2 + \Delta\Phi_3) \\ &= (-234 + 131 + 304) \div 3 \\ &= +67 \; [\mu m] \end{aligned}$$

Therefore, the phase shift centroid G can be regarded as being set in position deviated from the central portion of the cavity towards the other end facet B side. That is, in this case, the other end facet B may be set to have high reflectivity and the one end facet A may be set to have low reflectivity.

In this invention, the performances of high power and linearity of light output can be simultaneously achieved in a DFB laser whose end facets have asymmetrical reflectivity by satisfying at least one of the conditions expressed by the expressions (1) and (2). Further, in a case where a plurality of phase shifting portions or phase shifting areas are provided, the centroid G is defined by the equation (3) and each of the reflectivity of the end facets can be easily determined to be high or low reflectivity according to the position of the centroid G.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A high power distributed feedback semiconductor laser which is excellent in the linearity of light output has a periodic structure formed along the laser medium in the axial direction of a cavity and in which one of the end facet of said cavity has high reflectivity and the other end facet has low reflectivity, comprising a phase shifting portion, that is, a phase discontinuous portion of said periodic structure which is disposed in position deviated from the central portion of said resonator towards the high-reflectivity end facet, wherein the phase shift $\Delta\Phi$ of said phase shifting portion is set to exceed $3\pi/4$ which is represented in terms of the phase of waveguiding light (which corresponds to $3\lambda/8$ when the lasing wavelength is $\lambda$).

2. A high power distributed feedback semiconductor laser which is excellent in the linearity of light output has a periodic structure formed along the laser medium in the axial direction of a cavity and in which one of the end facet of said cavity has high reflectivity and the other end facet has low reflectivity, comprising a phase shifting area having the same effect as a phase discontinuous portion of said periodic structure and disposed in position deviated from the central portion of said cavity towards the high-reflectivity end facet, wherein the phase shift $\Delta\Phi$ of said phase shifting portion is set to exceed $3\pi/4$ which is represented in terms of the phase of waveguiding light (which corresponds to $3\lambda/8$ when lasing wavelength is $\lambda$).

3. A high power distributed feedback semiconductor laser which is excellent in the linearity of light output according to claim 2, wherein the length $L'$ of said phase shifting area in the axial direction is not less than 1/10 of the total length L of said cavity in the axial direction.

4. A high power distributed feedback semiconductor laser which is excellent in the linearity of light output according to claim 1 or 2, wherein a plurality of phase shifting portions or phase shifting areas are provided in said cavity, the axial direction (light emitting direction) of said cavity is set as an X axis, the central portion of said cavity is set as an origin O ($x=0$), one end facet side is set negative and the other end facet side is set positive, the weighted mean value of distances $L_i$ ($i=1, 2, ---$) from the origin O to the central points of said respective phase shifting portions or phase shifting areas is derived by use of the phase shifts $\Delta\Phi_i$ ($i=1, 2, ---$) of said phase shifting areas as weights and is defined as the centroid G, that is, $G = \Sigma(L_i \cdot \Delta\Phi_i)/\Sigma\Delta\Phi_i$, and when the position of the centroid G is negative, said one end facet is set to have high reflectivity and said other end facet is set to have low reflectivity, and when the position of the centroid G is positive, said one end facet is set to have low reflectivity and said other end facet is set to have high reflectivity.

* * * * *

UNITED STATES PATENT AND TRADEMARK OFFICE
CERTIFICATE OF CORRECTION

PATENT NO. : 5,353,298
DATED : October 04, 1994
INVENTOR(S) : Akio MAKUTA

It is certified that error appears in the above-indentified patent and that said Letters Patent is hereby corrected as shown below:

On the title page item [57], line 3, change "facet" to --facets--.

Signed and Sealed this

Sixteenth Day of May, 1995

Attest:

BRUCE LEHMAN

Attesting Officer     Commissioner of Patents and Trademarks